(12) United States Patent
Hook et al.

(10) Patent No.: US 11,362,409 B2
(45) Date of Patent: Jun. 14, 2022

(54) ANTENNA ASSEMBLY WITH UNIVERSAL WHIP MOUNT AND METHOD OF TUNING THE SAME

(71) Applicants: Frederic Dent Hook, Fontana, CA (US); Holley Masch, Scottsdale, AZ (US)

(72) Inventors: Frederic Dent Hook, Fontana, CA (US); Holley Masch, Scottsdale, AZ (US)

(73) Assignee: Wicked Technology Corporation, Scottsdale, AZ (US)

( * ) Notice: Subject to any disclaimer, the term of this patent is extended or adjusted under 35 U.S.C. 154(b) by 270 days.

(21) Appl. No.: 16/442,139

(22) Filed: Jun. 14, 2019

(65) Prior Publication Data

US 2019/0386373 A1    Dec. 19, 2019

Related U.S. Application Data

(60) Provisional application No. 62/685,179, filed on Jun. 14, 2018.

(51) Int. Cl.
*H01Q 1/08* (2006.01)
*H05K 7/14* (2006.01)
*H01Q 1/10* (2006.01)

(52) U.S. Cl.
CPC ............... *H01Q 1/085* (2013.01); *H01Q 1/10* (2013.01); *H05K 7/1434* (2013.01)

(58) Field of Classification Search
CPC .......... H01Q 1/085; H01Q 1/088; H01Q 1/10; H01Q 1/12; H01Q 1/20; H01Q 5/50; H01Q 9/14; H01Q 9/145; H01Q 9/30; H01Q 9/32; H05K 7/1434
See application file for complete search history.

(56) References Cited

U.S. PATENT DOCUMENTS

| | | | |
|---|---|---|---|
| 4,080,604 A * | 3/1978 | Wosniewski | H01Q 9/30 343/750 |
| 4,673,949 A | 6/1987 | Sheriff | |
| 4,751,514 A | 6/1988 | Sheriff | |
| 4,940,991 A | 7/1990 | Sheriff | |
| D310,670 S | 9/1990 | Sheriff | |
| 4,975,713 A | 12/1990 | Sheriff | |
| 5,202,696 A | 4/1993 | Sheriff | |
| 5,883,600 A * | 3/1999 | Kukura | H01Q 9/30 343/846 |

* cited by examiner

*Primary Examiner* — Robert Karacsony
(74) *Attorney, Agent, or Firm* — Brian Beverly

(57) ABSTRACT

An antenna assembly according to the invention includes a universal whip mount for mounting one of a variety of antenna whips to the antenna assembly, a loading coil inductor and a circuit board having a combination of both fixed and variable capacitors. The antenna assembly of the invention can be tuned to a wide range of frequencies with minimal disassembly and without soldering.

20 Claims, 12 Drawing Sheets

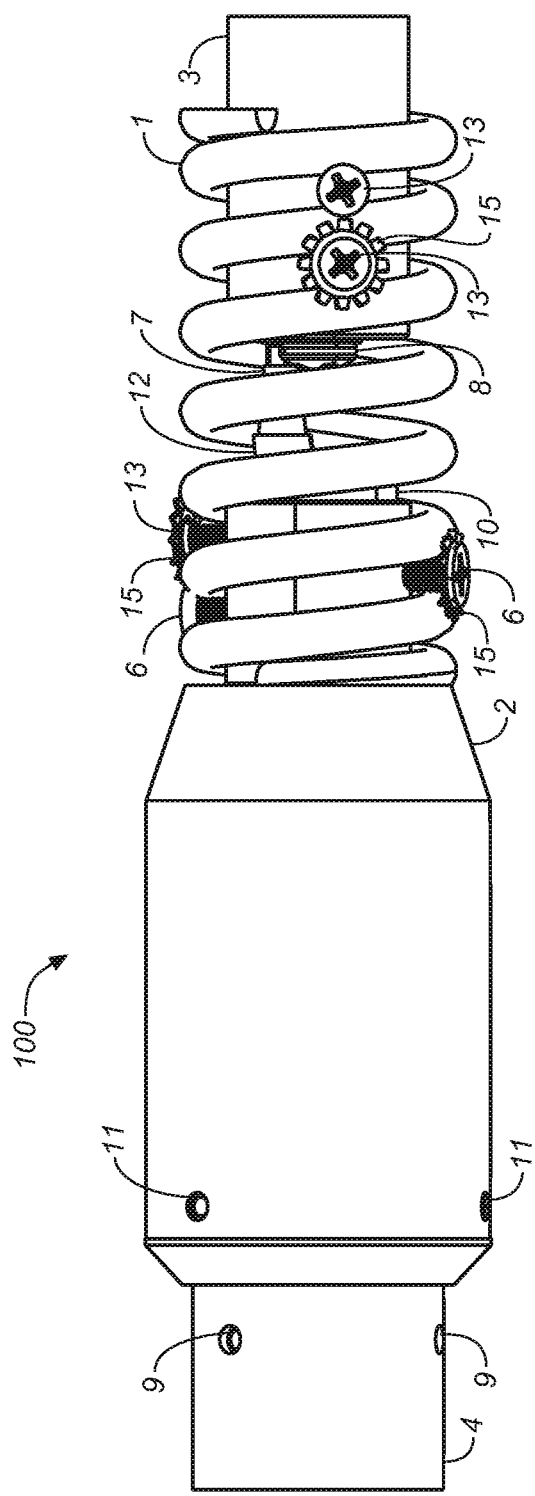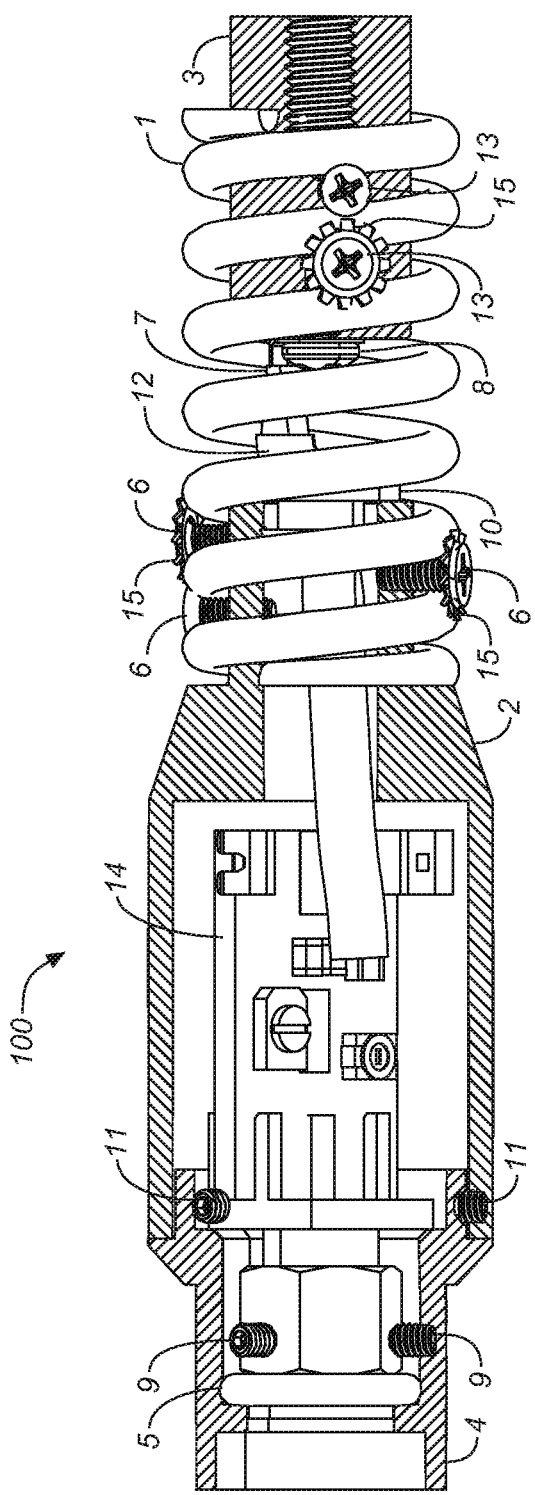
FIG. 2A
FIG. 2B

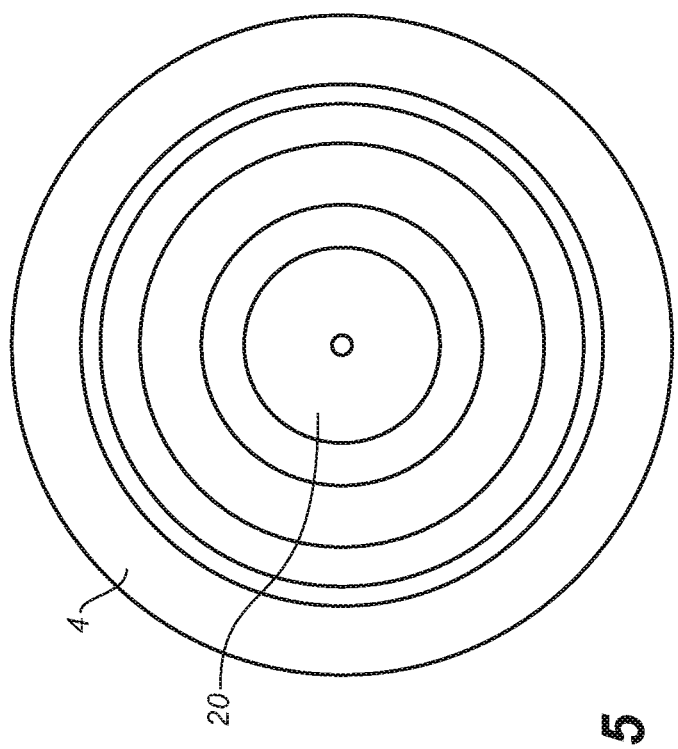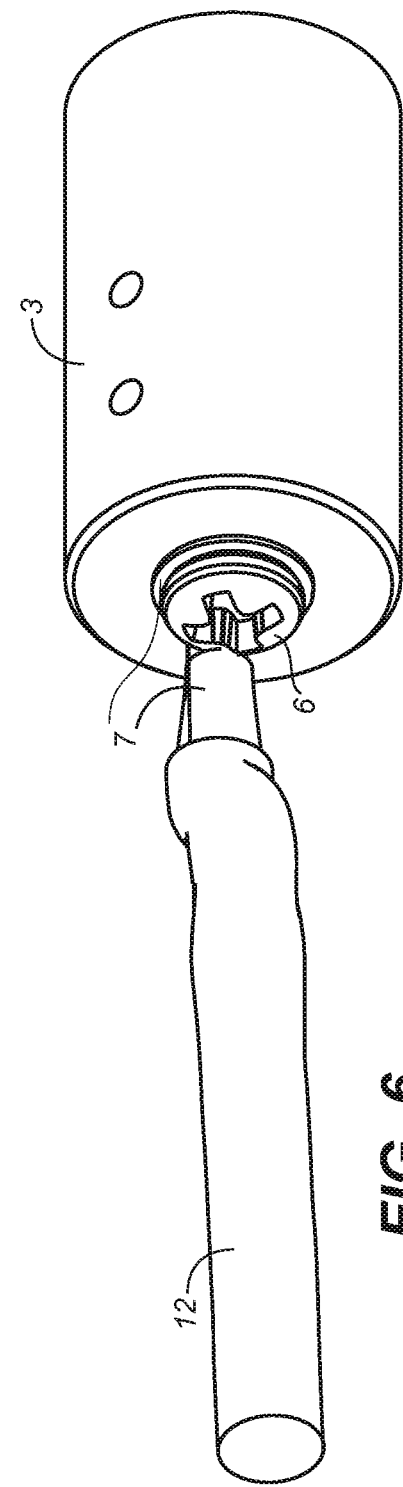
FIG. 5
FIG. 6

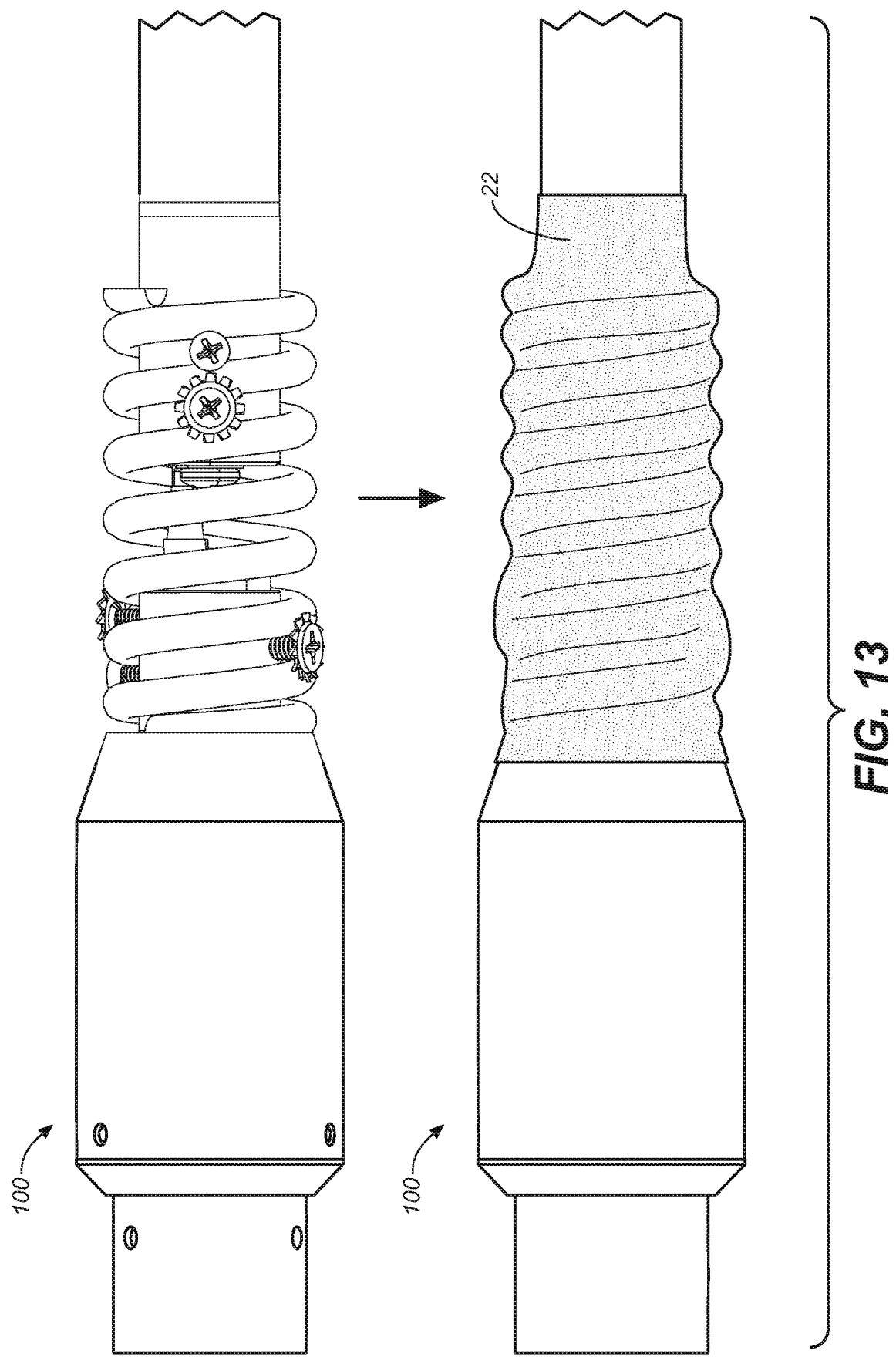

ANTENNA ASSEMBLY WITH UNIVERSAL WHIP MOUNT AND METHOD OF TUNING THE SAME

CROSS-REFERENCE TO RELATED APPLICATIONS

This application claims the benefit of U.S. Provisional Application No. 62/685,179 filed Jun. 14, 2018.

BACKGROUND

Field of the Invention

The present invention generally relates to radio antennas and, more particularly, to an antenna assembly with a universal whip mount and a method of tuning the same.

SUMMARY OF THE INVENTION

In an embodiment of the invention, an antenna assembly includes a universal whip mount for mounting any one of a variety of antenna whips to the antenna assembly, a loading coil inductor and a circuit board having a combination of both fixed and variable capacitors.

In addition to being universally compatible with a variety of antenna whips, including telescopic whips, shorty steel cable whips and Nitinol (nickel-titanium) whips, the antenna assembly of the invention can be tuned to a wide range of frequencies by simply rotating the whip mount such that it moves axially with respect to the coil and by adjusting one or more variable capacitors located on the circuit board. This tuning method can be performed with minimal disassembly of the antenna assembly and without soldering, thus allowing for simplified tuning compared to prior art antenna assemblies.

Other aspects and advantages of the invention will be apparent from the following description and the accompanying drawings.

BRIEF DESCRIPTION OF THE DRAWINGS

An exemplary embodiment of the invention will be described with reference to the accompany drawings, in which:

FIG. 2A shows an assembled view thereof.

FIG. 2B shows a second assembled view thereof with a cross-sectional view of the barrel housing and whip mount enclosures to show internal components disposed therein.

FIG. 5 shows a bottom view of the base shroud and couple adapter of the circuit board of the antenna assembly.

FIG. 6 shows a detailed view of the universal whip mount, stranded wire and ring terminal of the antenna assembly.

FIG. 13 shows another assembled view antenna assembly with an antenna whip mounted thereto.

DETAILED DESCRIPTION OF THE ILLUSTRATED EMBODIMENTS

Antenna Assembly

Figure 1:
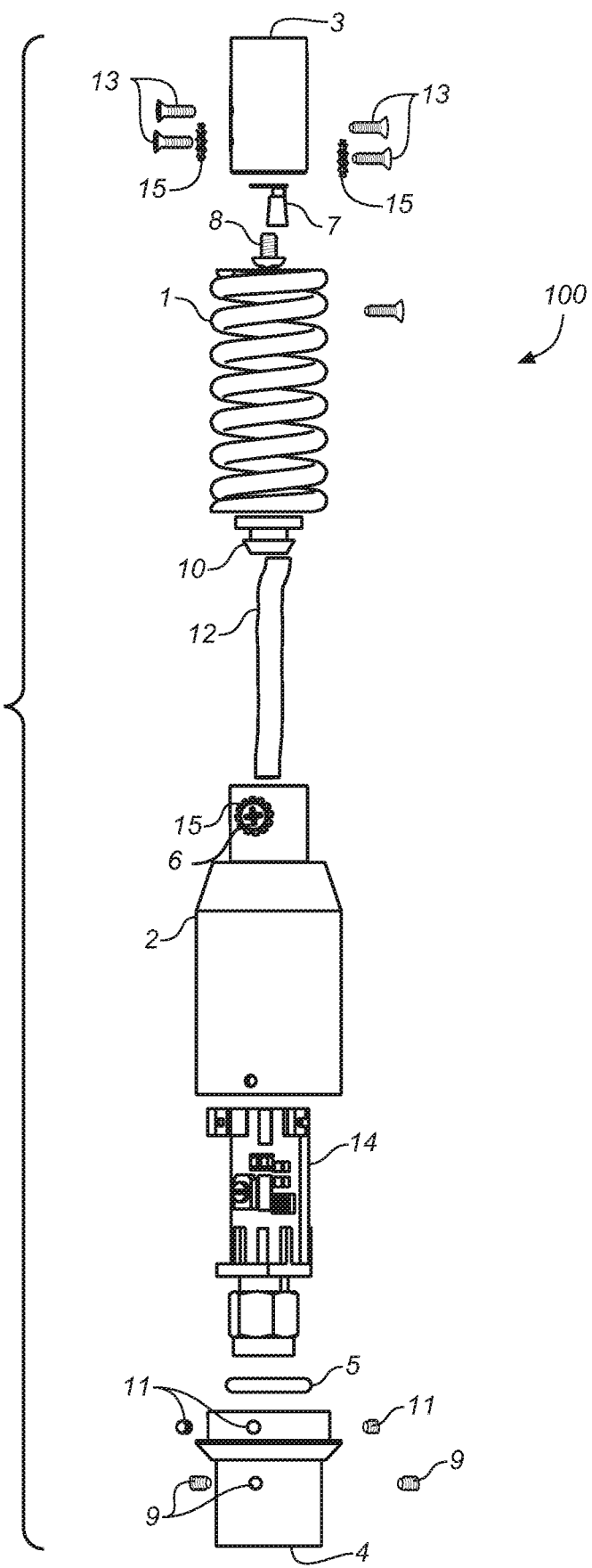
FIG. 1 shows an exploded view of an antenna assembly in accordance with the invention.

An antenna assembly (100) according to the invention is shown in an exploded view in FIG. 1 and as assembled in FIGS. 2A and 2B. FIG. 2B provides a cross-sectional view of the enclosure components of the antenna assembly in order to show the internal components disposed therein. The antenna assembly includes a beryllium copper spring (1) that serves as a loading coil inductor. As shown in the detailed view of FIG. 3, the spring (1) is mounted flush against the top shoulder of a barrel housing (2) and is secured to the barrel housing with a set of screws (6) and tooth lock washers (15). The screws (6) are positioned between the loops of the spring (1) and are fastened into the neck of the barrel housing (2), with the tooth lock washers (15) maintaining direct contact with the spring (1). Also shown is a rubber sealing grommet (10). A narrow end of the grommet (10) is positioned flush within an opening (26) in the top face of the barrel housing (2).

Figure 4:
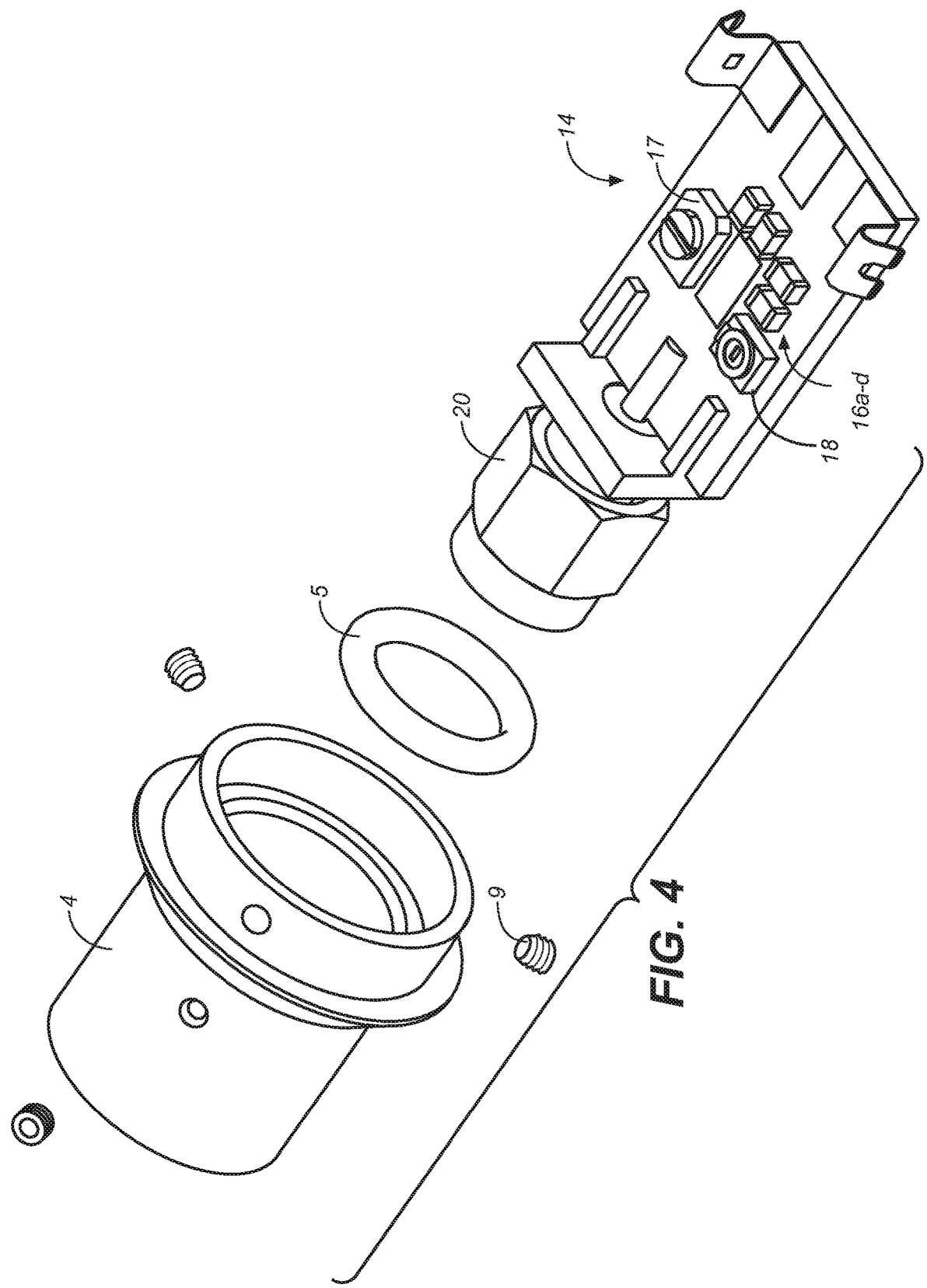
FIG. 4 shows a detailed exploded view of the circuit board and base shroud of the antenna assembly.

FIG. 4 shows a detailed view of a base shroud (4) and printed circuit board (14) of the antenna assembly. As described in detail below, with respect to FIG. 10 and the tuning method of the antenna assembly, the circuit board (14) includes an array of fixed (16a-d) and variable (17, 18) capacitors. A gold-plated coupling adapter (20) on the circuit board (14) is aligned with the bottom of the base shroud (4) and is secured with an O-ring (5). As shown in FIG. 5, the coupling adapter (20) is positioned concentric with the bottom opening of the base shroud (4) and is configured to connect the antenna assembly to a radio device.

FIG. 6 shows a detailed view of a universal whip mount (3), stranded wire (12) and crimp ring terminal (7) of the antenna assembly. One end of the stranded wire (12) is stripped and inserted into the ring terminal (7), and the ring terminal (7) is aligned with a small threaded hole at the base of the whip mount (3). The ring terminal (7) is securely tightened to the whip mount (3) with a screw (6) which is fastened into the threaded hole at the base of the whip mount (3) and is bent 90° so that that the stranded wire (12) extends axially from the whip mount (3), as shown.

Figure 7:
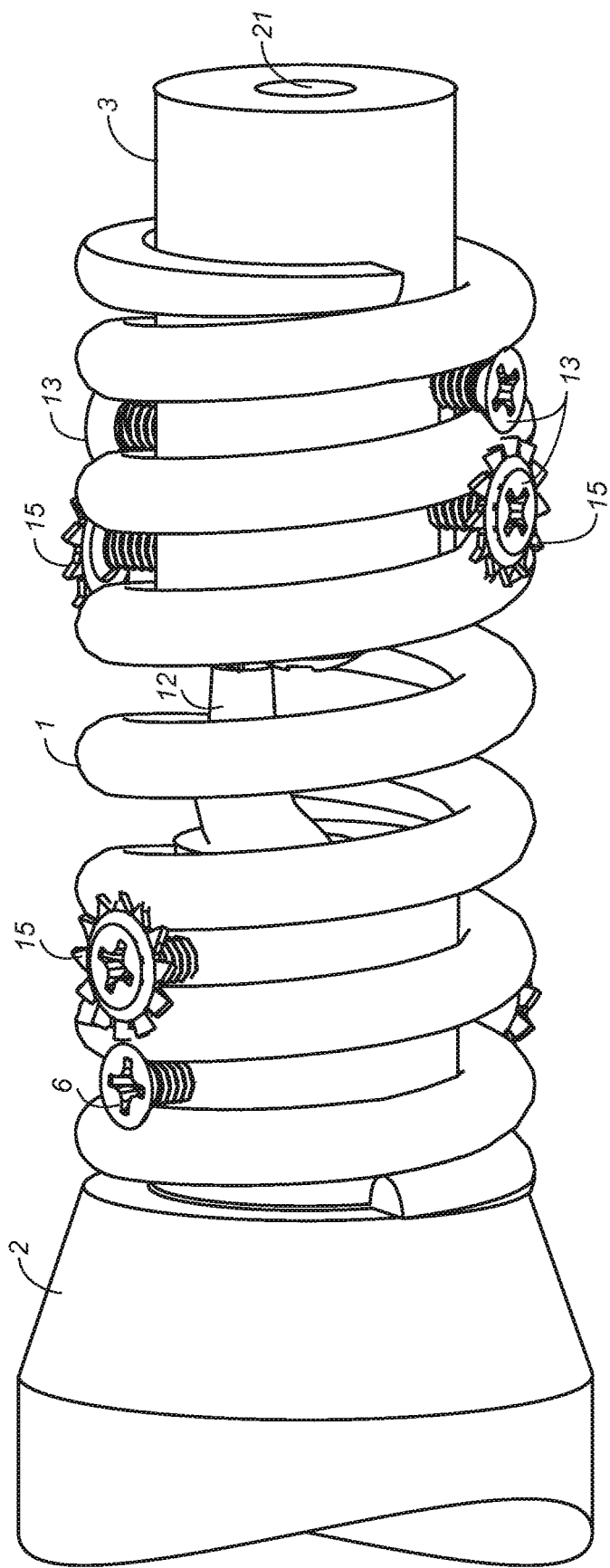
FIG. 7 shows a detailed view of the universal whip mount, loading coil and barrel housing of the antenna assembly.
Figure 9:
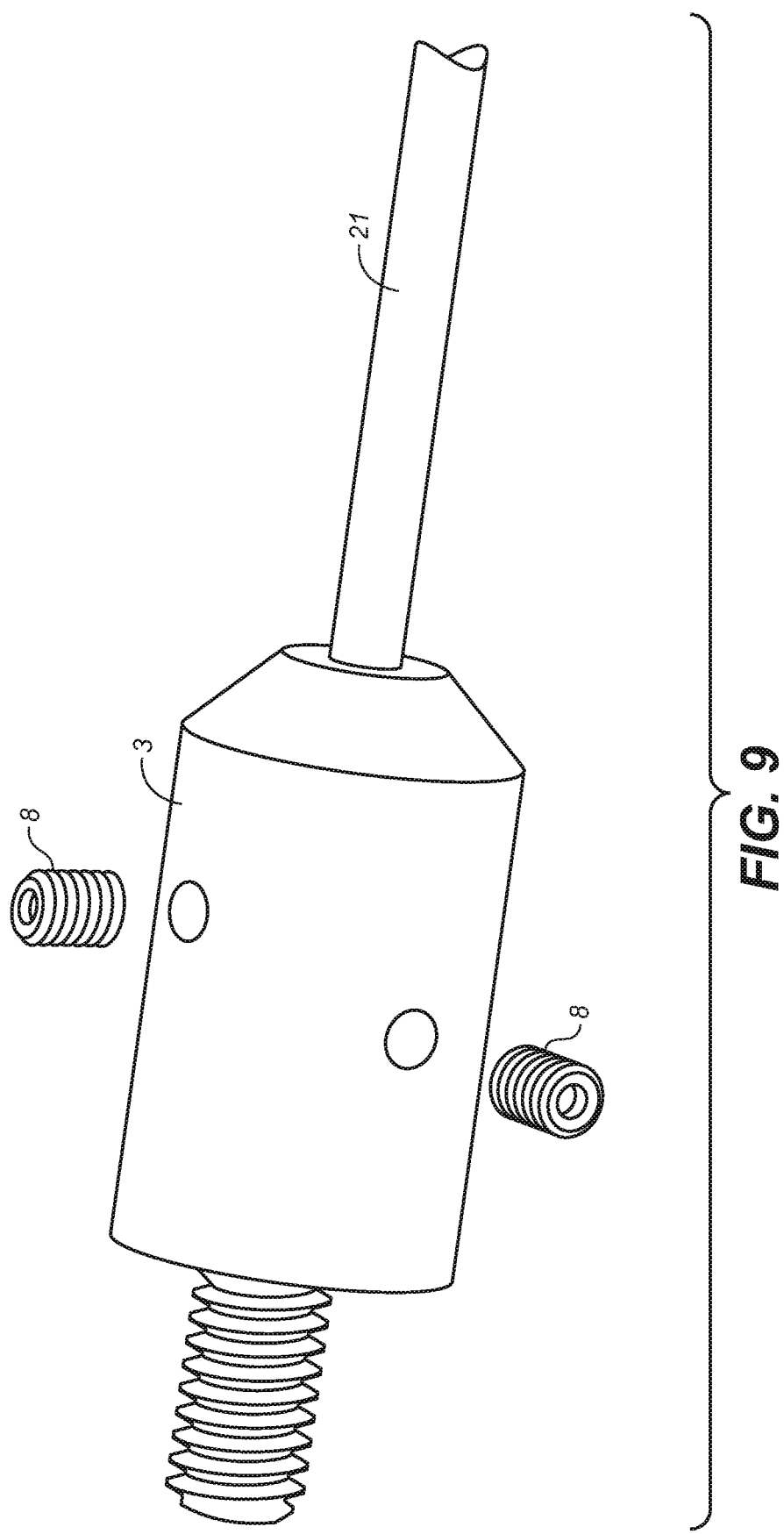
FIG. 9 shows a detailed view of the universal whip mount of the antenna assembly with an antenna whip mounted thereto.

As shown in FIG. 7, the top of the whip mount (3) includes another threaded hole (21) at the top face of the whip mount (3) configured to receive either a threaded whip element, such as a telescopic whip or shorty steel cable whip, or a non-threaded whip element, such as a Nitinol (nickel-titanium) whip, as described in further detail below with respect to FIG. 9.

The whip mount (3) is positioned within the spring (1) with the stranded wire (12) extended through the sealing grommet (10) and into the barrel housing (2). The spring (1) and whip mount (3) are secured to one another with an additional set of screws (13) and tooth lock washers (15). The screws (13) are positioned between the loops of the spring (1) and fastened to the sides of the whip mount (3).

Figure 8:
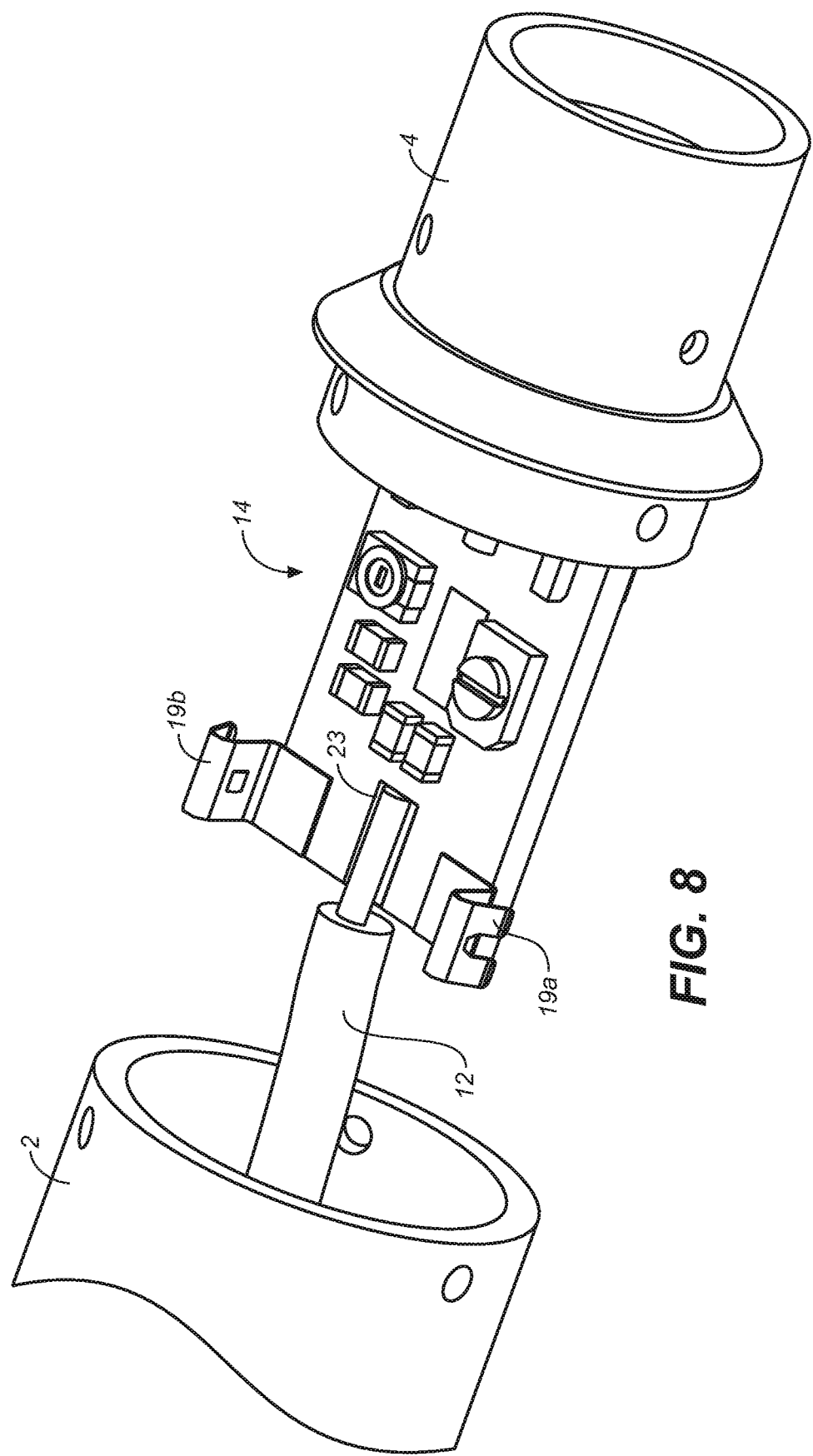
FIG. 8 shows a detailed exploded view of the circuit board, barrel housing and base shroud of the antenna assembly.

The other stripped end of the stranded wire (12) opposite the whip mount (3) is, as shown in FIG. 8, soldered to a center pad (23) on the circuit board (14). Two spring contacts (19a, 19b) on the circuit board (14) compress against the inner walls of the barrel housing (2), centering the circuit board (14) within the tube of barrel housing (2). The base shroud (4) is secured to the bottom of the barrel housing (2) with an additional set of screws (9, 11) (See FIGS. 1-2b).

Telescopic or shorty steel cable whip elements require no additional construction of the antenna assembly and can simply be threaded into the hole (21) at the top of the whip mount (3). A Nitinol whip, or other non-threaded whip element, can be inserted into the hole (21) of the whip mount (3) and fixed in place with a set of screws (8), as shown in FIG. 9.

Figure 12:
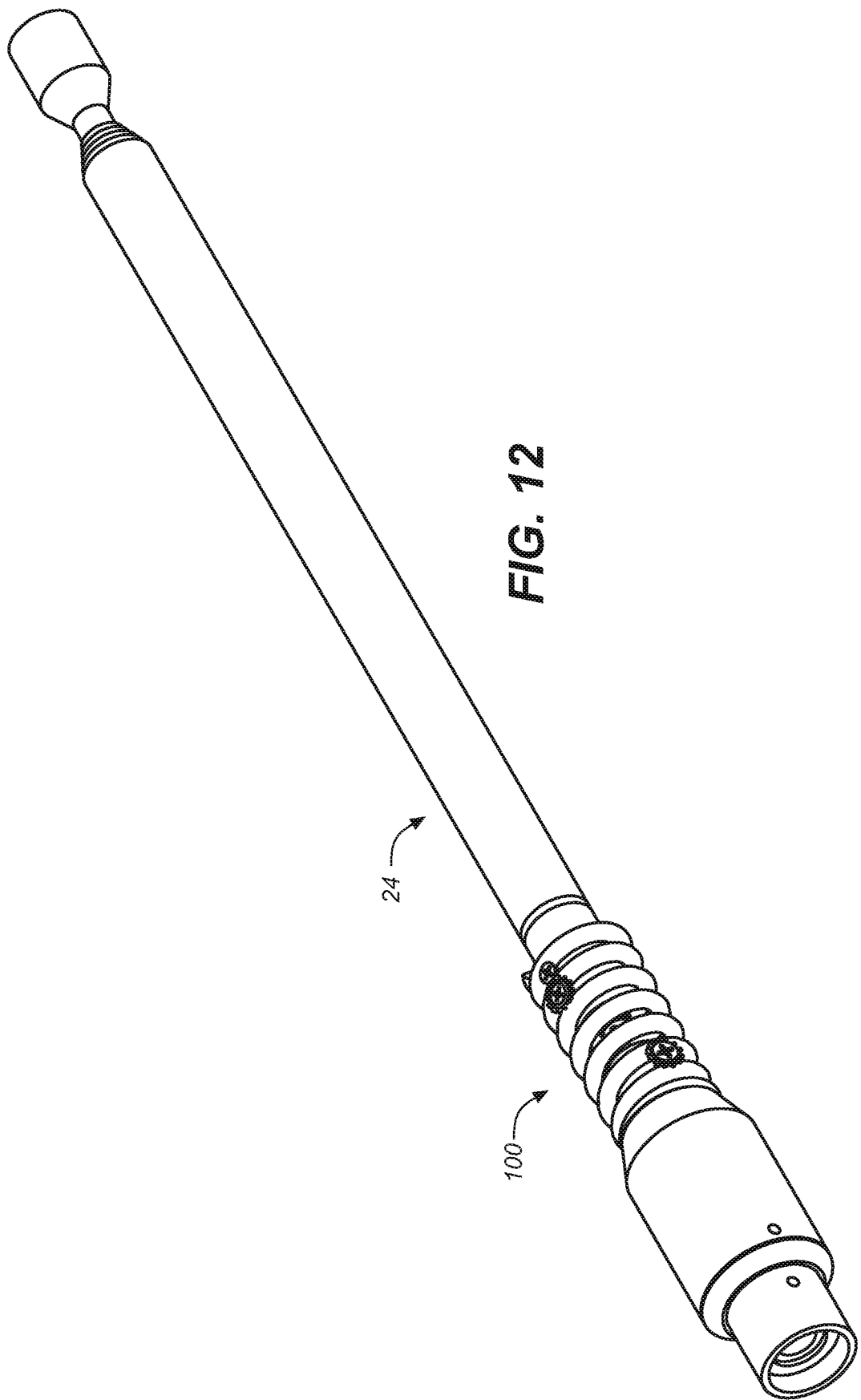
FIG. 12 shows another assembled view of an antenna assembly in accordance with the invention.

FIG. 12 shows an example of a fully constructed antenna assembly (100) with an antenna whip element (24) installed.

Tuning Method

Figure 10:
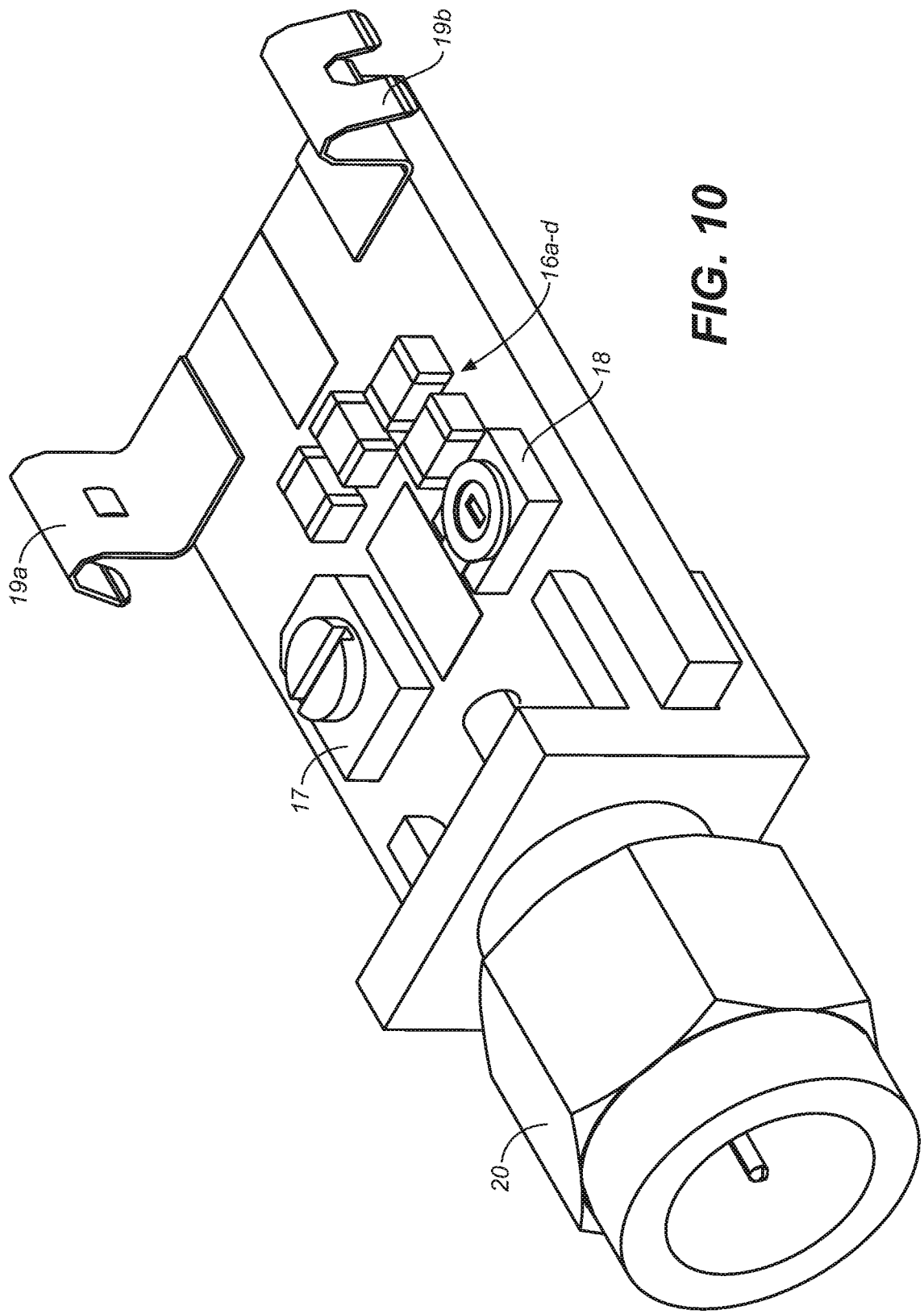
FIG. 10 shows a detailed view of the circuit board of the antenna assembly.

The tuning method of the antenna assembly (100) in accordance with the invention will now be described with reference to FIG. 10. FIG. 10 shows a detailed view of the circuit board (14) of the antenna assembly, which includes four fixed capacitors (16a, 16b, 16c, and 16d), a large trimmer (i.e., variable) capacitor (17) and a small trimmer capacitor (18). It should be understood that the invention can be implemented using a circuit board having a different number of fixed and variable capacitors, as long as a majority of the capacitance of the antenna assembly is provided by one or more stable, fixed capacitors. For example, some embodiments of the invention may include no variable capacitors, while other embodiments may include at least one variable capacitors that allow for additional adjustability to the capacitance of the antenna assembly.

The element of the antenna assembly that provides for the greatest tuning adjustment is the positioning of the whip mount (3) within the spring inductor (1), which sets the inductance of the antenna circuit. The tuning process thus begins with a loosening of the screws (6) connecting the spring (1) to the whip mount (3) and a rotation of the whip mount (3) such that it moves, together with the loosened screws (6), up or down the coil of the spring (1), with the tooth lock washers (15) maintaining contact with the spring (1). Exposing more of the spring (1) between the barrel housing (2) and the whip mount (3) results in a greater inductance in the antenna circuit and lowers the operating frequency of the antenna assembly. Exposing less of the spring (1) between the barrel housing (2) and the whip mount (3) results in less inductance in the antenna circuit and increases the operating frequency of the antenna assembly.

Once the whip mount (3) has been rotated along the spring (1) to a position that yields an operating frequency close to the desired range, the screws (6) connecting the spring (1) to the whip mount (3) can be fastened and the whip mount (3) secured in position. Fine tuning adjustments can then be performed using the variable trimmer capacitors (17, 18) on the circuit board (14).

Figure 11:
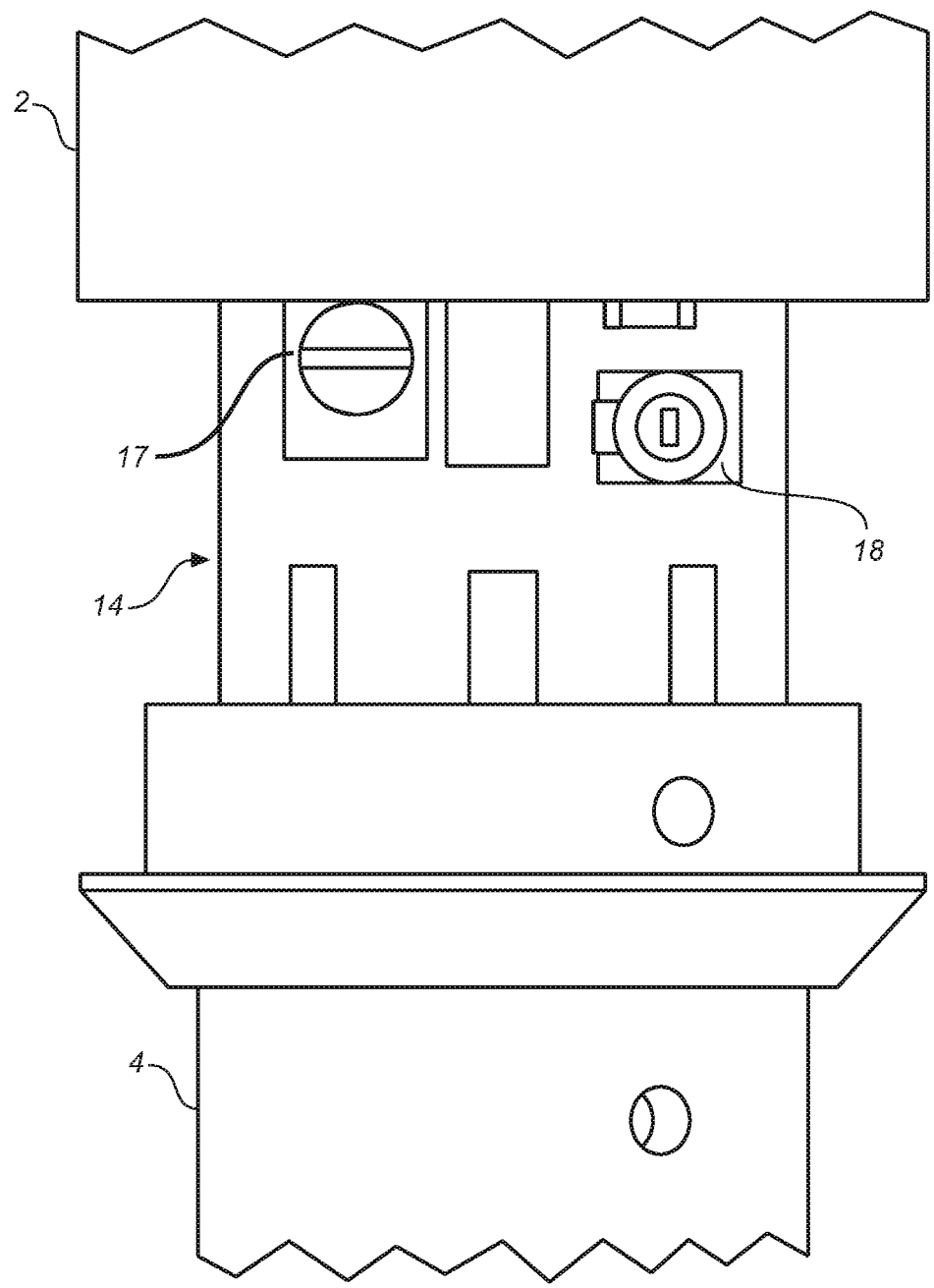
FIG. 11 shows a detailed exploded view of the circuit board, barrel housing and base shroud of the antenna assembly.

A vector network analyzer can be used to monitor the standing wave ratio (SWR) or return loss of the antenna assembly, and the variable capacitors (17, 18) can be adjusted to provide the lowest SWR (largest negative return loss) for the desired operating frequency. The large trimmer capacitor (17) should be adjusted first, with the smaller trimmer capacitor (18) (which has less effect) adjusted second. As shown in FIG. 11, fine tune adjustments using the variable trimmer capacitors (17, 18) are performed by sliding the barrel housing (2) up away from the base shroud (4) to expose the trimmer capacitors (17, 18) while simultaneously keeping the spring contacts (19a, 19b) of the circuit board (14) well inside the inner tube of the barrel housing (2). The spring contacts (19a, 19b) provide the ground return path for the antenna circuit. A fine straight blade screwdriver, or similar, can be used to adjust the large trimmer capacitor (17), while a fine ceramic trimmer adjustment tool, or similar, can be used to adjust the smaller trimmer capacitor (18). Generally, the larger trimmer capacitor (17) adjusts the frequency response of the antenna circuit, while the smaller trimmer capacitor (18) adjusts the impedance match of the antenna circuit and optimizes the SWR of the antenna circuit for the desired frequency.

The four external tooth lock washers (15) (See FIG. 1) of the antenna assembly ensure that the screws (6, 13), which both mechanically hold and electrically connect the spring (1) to the barrel housing (2) and the whip mount (3), maintain a proper electrical connection. When adjusting the position of the spring (1) for tuning purposes, the screws (6) must remain tight enough to ensure that the sides of each tooth lock washer (15) maintain contact with the spring (1).

Figure 3:
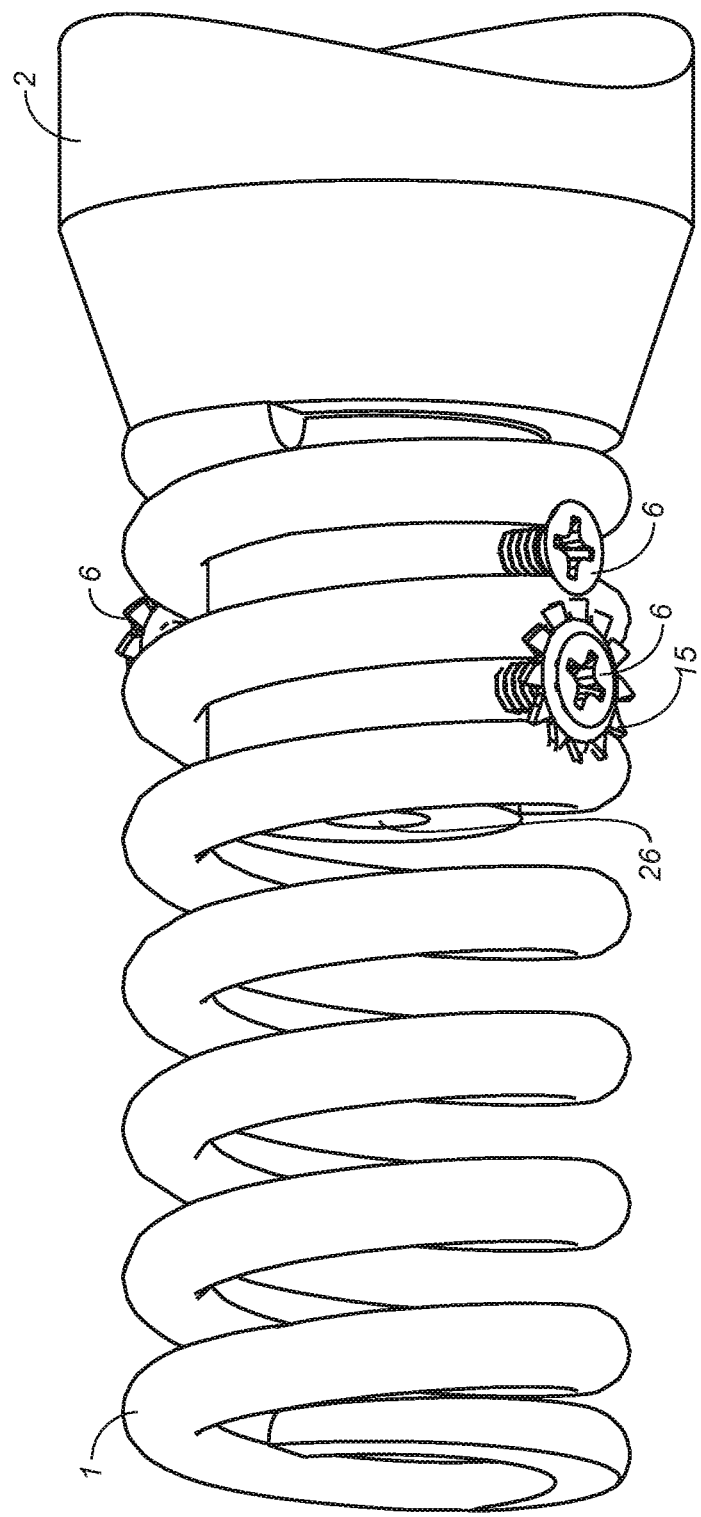
FIG. 3 shows a detailed view of the loading coil and barrel housing of the antenna assembly.

Once a desired fine tuning has been achieved, final assembly involves closing the combination base shroud (4) and barrel housing enclosure (2) and fastening the enclosure together with a set of screws (11) (See FIGS. 1 to 3). Lastly, shrink tubing (22) is used to cover and secure the fastened spring (1), barrel enclosure (2) and whip mount (3), as shown in FIG. 13.

An embodiment of the invention has thus been described and illustrated herein in detail. The invention provides for an antenna assembly that is universally compatible with a variety of antenna whips and a tuning method that can be performed with minimal disassembly of the antenna assembly and without soldering.

The illustrated embodiment is merely one example implementation of the invention and is not to be taken as limiting, the spirit and scope of the invention being limited only by the terms of the appended claims and their legal equivalents.

We claim:

1. An antenna assembly comprising:
    a loading coil,
    a cylindrical whip mount configured to receive a whip antenna, the whip mount releasably fastened within and electrically connected to the coil such that a rotation of the whip mount relative to the coil moves the whip mount axially with respect to the coil, and
    a circuit board electrically connected to the whip mount and coil and configured to establish a closed circuit within the antenna assembly, the circuit hoard positioned a fixed distance apart from the coil and having one or more fixed capacitors configured to provide a majority of the capacitance of the circuit,
    wherein a movement of the whip mount axially with respect to the coil modifies the inductance of the circuit for setting the operating frequency of the antenna assembly.

2. The antenna assembly of claim 1, the circuit board further comprising:
    one or more variable capacitors configured to finely adjust the capacitance of the circuit.

3. The antenna assembly of claim 1, further comprising:
    an enclosure configured to maintain the circuit board a fixed distance away from the coil.

4. The antenna assembly of claim 1, wherein the whip mount is releasably fastened to and electrically connected to the coil by one or more screws disposed within loops of the coil such that a loosening of the screws and a rotation of the whip mount together with the screws moves the whip mount axially with respect to the coil.

5. The antenna assembly of claim 1, wherein the whip mount is configured to receive either a threaded whip antenna or a non-threaded whip antenna.

6. The antenna assembly of claim 5, wherein, the whip mount is configured to receive any one of a telescopic whip antenna, a shorty steel cable whip antenna or a nickel-titanium whip antenna.

7. The antenna assembly of claim 1, further comprising:
a coupling adapter electrically connected to the circuit board and configured to connect the antenna assembly to a radio device.

8. The antenna assembly of claim 3, the enclosure comprising:
a barrel housing configured to attach to and cover the circuit board and configured to attach to the coil such that the circuit board is maintained a fixed distance away from the coil.

9. The antenna assembly of claim 1, further comprising a strand wire configured to electrically connect the circuit board to the whip mount.

10. The antenna assembly of claim 1, wherein the coil comprises a beryllium copper spring.

11. The antenna assembly of claim 2, wherein the one or more variable capacitors comprise:
a large trimmer capacitor, and
a smaller trimmer capacitor.

12. A method of tuning the antenna assembly of claim 1, comprising
rotating the whip mount such that it moves axially with respect to the coil.

13. A method of tuning the antenna assembly of claim 2, comprising
rotating the whip mount such that it moves axially with respect to the coil, and
turning the one or more variable capacitors.

14. An antenna assembly comprising:
a loading coil comprising a beryllium copper spring,
a cylindrical whip mount configured to receive either a threaded or non-threaded whip antenna, the whip mount releasable fastened within the coil by one or more screws disposed within loops of the coil such that a rotation of the whip mount together with the screws moves the whip mount axially with respect to the coil,
a circuit board electrically connected to the whip mount and coil and establishing a closed circuit within the antenna assembly, the circuit board including a plurality of fixed capacitors, a large trimmer capacitor and a smaller trimmer capacitor, the plurality of fixed capacitors configured to provide a majority of the capacitance of the circuit and the large trimmer capacitor and the smaller capacitor configured to finely adjust the capacitance of the circuit when turned, and
an enclosure configured to maintain the circuit board a fixed distance away from the coil such that a movement of the whip mount axially with respect to the coil modifies the inductance of the circuit and sets the operating frequency of the antenna assembly.

15. A method of constructing and tuning an antenna assembly comprising:
fastening a cylindrical whip mount configured to receive an antenna whip to a loading coil such that the whip mount is releasably fastened within and electrically connected to the coil and such that a rotation of the whip mount moves the whip mount axially with respect to the coil,
connecting a circuit hoard to the whip mount and coil, the circuit board configured to establish a closed antenna circuit with the whip mount and coil and the circuit hoard having one or more fixed capacitors and one or more variable capacitors, the one or more fixed capacitors configured to provide a majority of the capacitance of the antenna circuit and the one or more variable capacitors configured to finely adjust the capacitance of the antenna circuit when turned, and
enclosing the circuit board in a housing configured to hold the coil a fixed distance away from the circuit board such that a movement of the whip mount axially with respect to the coil modifies the inductance of the antenna circuit and sets the operating frequency of the antenna circuit.

16. The method of claim 15, further comprising a step of tuning the operating frequency of the antenna circuit, the tuning comprising:
rotating the whip mount such that it moves axially with respect to the coil, and
turning the one or more variable capacitors.

17. The method of claim 16, the fastening step further comprising:
fastening the whip mount to the coil using one or more screws disposed within loops of the coil.

18. The method of claim 17, the tuning step further comprising, before the rotating step, a step of:
loosening the one or more screws such that a rotation of the whip mount together with the screws moves the whip mount axially with respect to the coil.

19. The method of claim 15, the enclosing step further comprising:
enclosing the circuit board in a housing comprising a barrel tube attached to a base shroud.

20. The method of claim 19, the tuning step further comprising, before the turning step, the step of:
detaching the barrel tube from the base shroud such that the circuit board is exposed from the housing and such that the one or more variable capacitors can be turned.

* * * * *